(12) United States Patent
Kurz

(10) Patent No.: US 7,538,437 B2
(45) Date of Patent: May 26, 2009

(54) INFRARED RECEIVER CHIP

(75) Inventor: Alexander Kurz, Schwaebisch Hall (DE)

(73) Assignee: Atmel Germany GmbH, Heilbronn (DE)

( * ) Notice: Subject to any disclaimer, the term of this patent is extended or adjusted under 35 U.S.C. 154(b) by 417 days.

(21) Appl. No.: 11/070,167

(22) Filed: Mar. 3, 2005

(65) Prior Publication Data
US 2005/0194538 A1  Sep. 8, 2005

(30) Foreign Application Priority Data
Mar. 3, 2004 (DE) .................. 10 2004 010 299

(51) Int. Cl.
*H01L 23/48* (2006.01)
*H01L 23/52* (2006.01)
*H01L 29/40* (2006.01)
(52) U.S. Cl. .................. 257/773; 257/784; 257/786
(58) Field of Classification Search ............. 257/734, 257/773, 784, 786
See application file for complete search history.

(56) References Cited

U.S. PATENT DOCUMENTS

| 5,923,092 A | 7/1999 | Kang |
| 5,962,854 A | 10/1999 | Endo |
| 6,664,620 B2 * | 12/2003 | Siu et al. .................. 257/692 |
| 6,686,580 B1 | 2/2004 | Glenn et al. |

FOREIGN PATENT DOCUMENTS

| DE | 196 52 395 A1 | 12/1997 |
| JP | 62065449 A | 3/1987 |
| JP | 01196138 A | 8/1989 |

OTHER PUBLICATIONS

A. Z. Walach, "Diagonally Shaped Chip Pad Arrangement," IBM Technical Disclosure Bulletin, vol. 26, No. 1, Jun. 1983, pp. 204-205.

* cited by examiner

*Primary Examiner*—Monica Lewis
(74) *Attorney, Agent, or Firm*—Muncy, Geissler, Olds & Lowe, PLLC

(57) ABSTRACT

An infrared receiver chip is provided for installation in a standardized lead frame of an infrared receiver module having multiple contact areas for connection of associated function points of the lead frame via bond wires, wherein at least one contact area is spaced apart from the outer edge of the infrared receiver chip and all contact areas are positioned with respect to one another such that, when the infrared receiver chip is installed in any standardized lead frame, the respective bond wires do not cross when the bond wires are routed directly from the associated contact area to the associated function point.

9 Claims, 4 Drawing Sheets

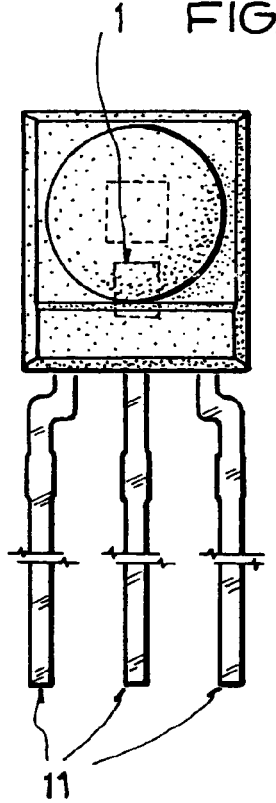
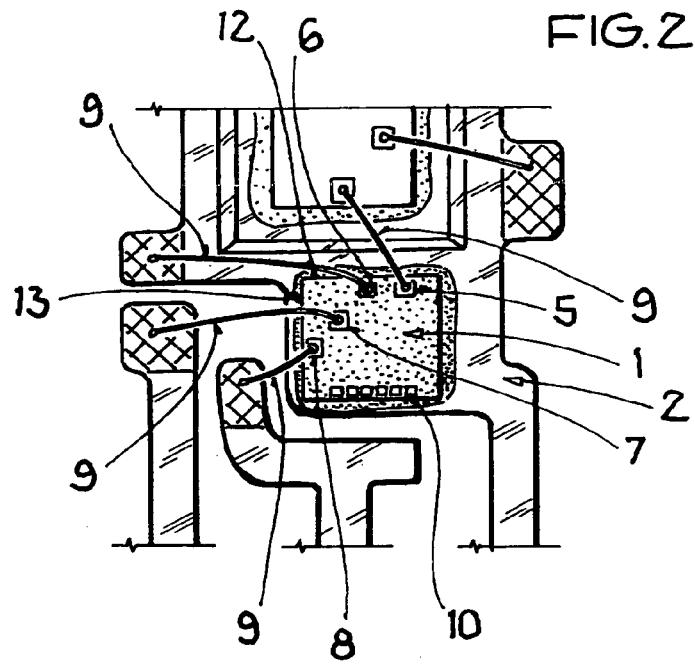
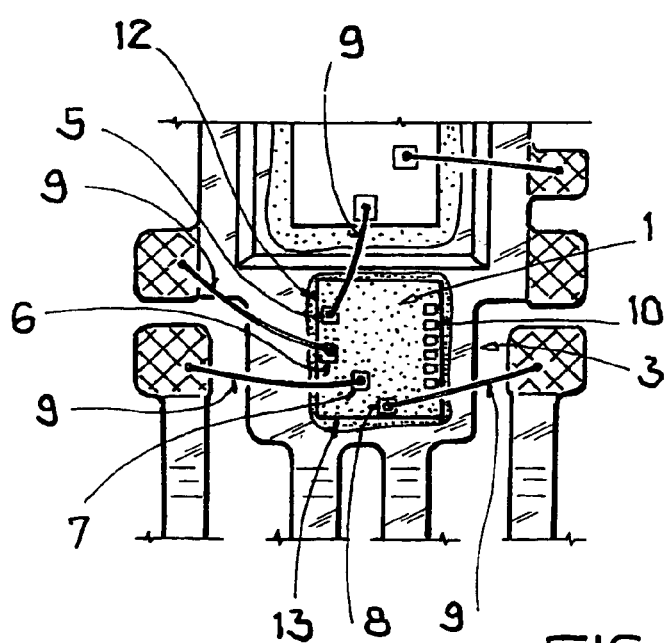

(CONVENTIONAL ART)

under 35 U.S.C. §119(a) on German Patent Application No. DE 102004010299.6 filed in Germany on Mar. 3, 2004, which is herein incorporated by reference.

BACKGROUND OF THE INVENTION

1. Field of the Invention

The present invention relates an infrared receiver chip for installation in a standardized lead frame of an infrared receiver module.

2. Description of the Background Art

Infrared receivers are used for data connections in carrier frequency modulated transmission applications, for example. Infrared receivers are especially known for electronic entertainment devices such as televisions, DVD players, satellite receivers, video recorders, CD players, and the like. In these applications, a remote control, for example, transmits IR light signals toward the infrared receiver module, where the received light signals are converted to electrical signals.

In general, various designs of infrared module exist, with at least two different designs of infrared receiver chips being used in order to accommodate the installation requirements of the different lead frame designs in the individual infrared receiver modules. In general, three standardized lead frame designs exist, which are explained in detail below with reference to FIGS. 5 through 7.

FIG. 5 illustrates a top view of a conventional infrared receiver chip 1 mounted in a first standardized lead frame 2. As can be seen in FIG. 5, the infrared receiver chip 1 has, for appropriate installation in the first standardized lead frame 2, at least one signal input contact area 5, a ground contact area 6, a signal output contact area 7, and a power supply contact area 8. The signal input contact area 5 is used to connect to a signal input point IN on the lead frame side, the ground contact area 6 is used to connect to a ground point GND on the lead frame side, the signal output contact area 7 is used to connect to a signal output point OUT on the lead frame side, and the power supply contact area 8 is used to connect to a power supply point VCC on the lead frame side. The individual connections and contact areas are connected by bond wires 9.

In addition, the infrared receiver chip 1 has additional contact areas 10 for welding the infrared receiver chip 1 into the associated lead frame 2.

FIGS. 6 and 7 illustrate a top view of a conventional infrared receiver chip 1 mounted in a second standardized lead frame 3 or in a third standardized lead frame 4. The infrared receiver chips 1, in turn, have the above-described contact areas 5, 6, 7, 8, and 10 for connection to the associated lead-frame-side signal input point, ground point, signal output point, and power supply point.

In this regard, the three standardized lead frames 2, 3, and 4 differ in that the individual connection points IN, GND, OUT, and VCC are provided at different positions, as can be seen in FIGS. 5, 6, and 7.

The second standardized lead frame 3 in FIG. 6 differs from the first standardized lead frame 2 in FIG. 5 in that the power supply point VCC is arranged on the opposite side of the signal output point OUT with respect to the infrared receiver chip 1 used, instead of being positioned on the same side.

The third standardized lead frame 4 in FIG. 7 differs from the first standardized lead frame 2 in FIG. 5 in that the signal output point OUT is arranged opposite the ground point GND with respect to the infrared receiver chip 1 used, and is positioned between the signal input point IN and the power supply point VCC. In addition, the power supply point is arranged on a different side edge of the chip 1 in comparison to the second standardized lead frame 3 in FIG. 6.

A basic problem in connecting such connection points with the contact areas provided on the infrared receiver chip 1 is that the bond wires 9 have to run as directly as possible from the given connection point to the associated contact area in order to keep the length of the bond wires as short as possible so that electromagnetic interference effects can be minimized. Furthermore, in order to avoid a short circuit of these lines, the individual bond wires 9 of the individual connections cannot cross or intersect.

In order to fulfill these requirements for installation in the different designs of standardized lead frames 2, 3, 4, at present there exist multiple different designs of infrared receiver chips 1 with different geometric arrangements of the individual contact areas.

For installation of an infrared receiver chip 1 in the first standardized lead frame 2 from FIG. 5 and the second standardized lead frame 3 from FIG. 6, a uniform infrared receiver chip 1 can be used, which, merely by rotation, permits a suitable orientation of the individual contact areas with respect to the associated contact points.

For installation of an infrared receiver chip 1 in the third standardized lead frame 4 from FIG. 7, however, such a receiver chip does not fulfill the requirements described above, so a different design of infrared receiver chip 1 is necessary in which the individual contact areas have a different geometric arrangement, as can be seen in FIG. 7.

However, this approach has been found to have the disadvantage that logistical management of two differently designed receiver chips, which under certain circumstances may also have different transmission protocols, is very resource-intensive and results in increased expenditure for logistics, and thus in a higher selling price.

SUMMARY OF THE INVENTION

It is therefore an object of the present invention to provide an infrared receiver chip that is equally suitable for installation in the three standardized lead frames 2, 3, and 4 from FIGS. 5, 6, and 7, respectively, and that meets the requirements described above.

Accordingly, an infrared receiver chip 1 for installation in a standardized lead frame of an infrared receiver module is provided with multiple contact areas for connection of associated function points of the lead frame via bond wires. At least one contact area is spaced apart from an outer edge of the infrared receiver chip and all contact areas are positioned with respect to one another such that, when the infrared receiver chip is installed in any standardized lead frame, the respective bond wires do not cross when the bond wires are routed directly from the associated contact area to the associated function point.

The idea that is the basis for the present invention is that the contact areas are positioned on the infrared receiver chip in a novel manner such that when the infrared receiver chip is appropriately installed in any standardized lead frame, the respective bond wires do not cross when running directly from the associated contact area to the associated function point or connection point. Here, the individual contact areas are not all arranged at the edge of the infrared receiver chip, but are displaced, at least in part, toward the center of the surface of the infrared receiver chip. In other words, at least one contact area is spaced apart from the outer edge of the infrared receiver chip and all contact areas are positioned with respect to one another such that the respective bond wires, which are designed as short as possible, do not intersect one another.

Thus, the present invention has the advantage over the prior art that just one uniform infrared receiver chip can be installed in the three standardized lead frames such that the requirement for the shortest possible bond wires and the requirement that the bond wires not intersect are fulfilled. As a result, the logistics problem that exists with different designs of infrared receiver chips is eliminated, making it possible to save costs.

According to a preferred embodiment, the contact areas for connection of a ground point, an output signal point, and a supply point are positioned on a common line which runs at an angle along the surface of the infrared receiver chip from a position approximately in the center of one side edge to a position approximately in the center of another side edge, preferably an adjacent side edge, of the infrared receiver chip, wherein the contact surface for connecting an input signal point is positioned on a line with the contact area for connection of the ground point, which line runs parallel to a side edge of the infrared receiver chip associated with the ground point or the input signal point.

According to another preferred example embodiment, the contact areas are all positioned on a common line, which runs at an angle along the surface of the infrared receiver chip from one side edge to another side edge, preferably an adjacent side edge, thereof.

For example, the contact areas can also be positioned together on the diagonal of the infrared receiver chip or slightly offset with respect thereto.

The infrared receiver chip is advantageously embodied as a semiconductor chip.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a top view of an infrared receiver module according to an example embodiment of the present invention;

FIG. 2 is a schematic top view of an infrared receiver chip according to an example embodiment of the present invention, which is installed in a first standardized lead frame;

FIG. 3 is a schematic top view of an infrared receiver chip according to an example embodiment of the present invention, which is installed in a second standardized lead frame;

DETAILED DESCRIPTION

Figure 4:
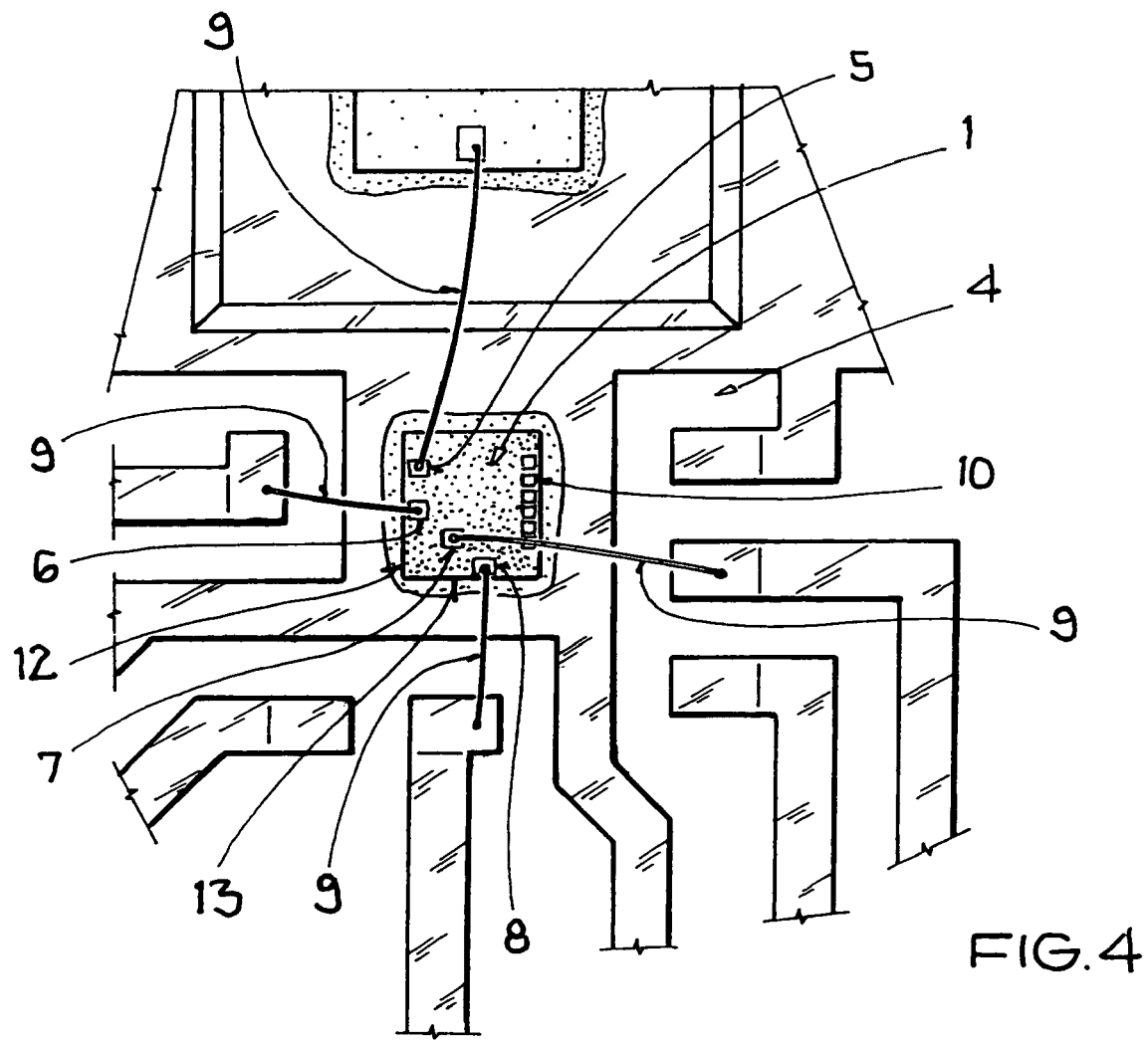
FIG. 4 is a schematic top view of an infrared receiver chip according to an example embodiment of the present invention, which is installed in a third standardized lead frame.

In the drawing figures, equivalent or functionally equivalent elements and components are labeled with the same reference characters, unless otherwise specified.

FIG. 1 illustrates a top view of an infrared receiver module according to an example embodiment of the present invention in which is integrated an infrared receiver chip 1 according to the invention. As can be seen in FIG. 1, the receiver module has outward-facing contact pins 11, which can be connected, for example, to corresponding ground points, signal receiving points, and power supply points of an end device.

FIG. 2 illustrates a schematic top view of an infrared receiver chip 1 according to an example embodiment of the present invention, which is installed in a first standardized lead frame 2 that is only shown in part.

Figure 5:
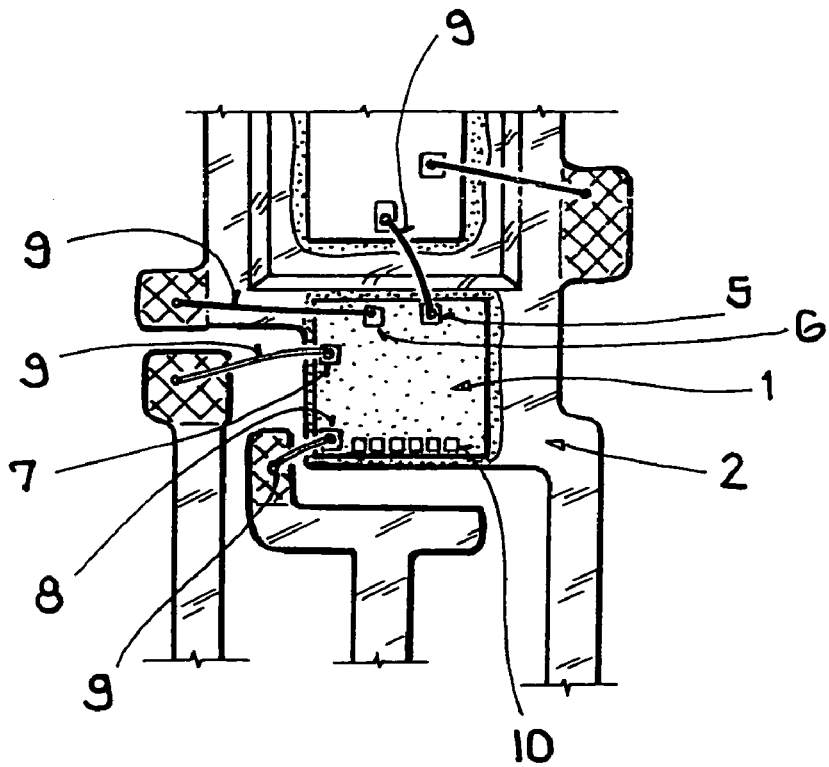
FIG. 5 is a schematic top view of a conventional infrared receiver chip, which is installed in a first standardized lead frame.
Figure 6:
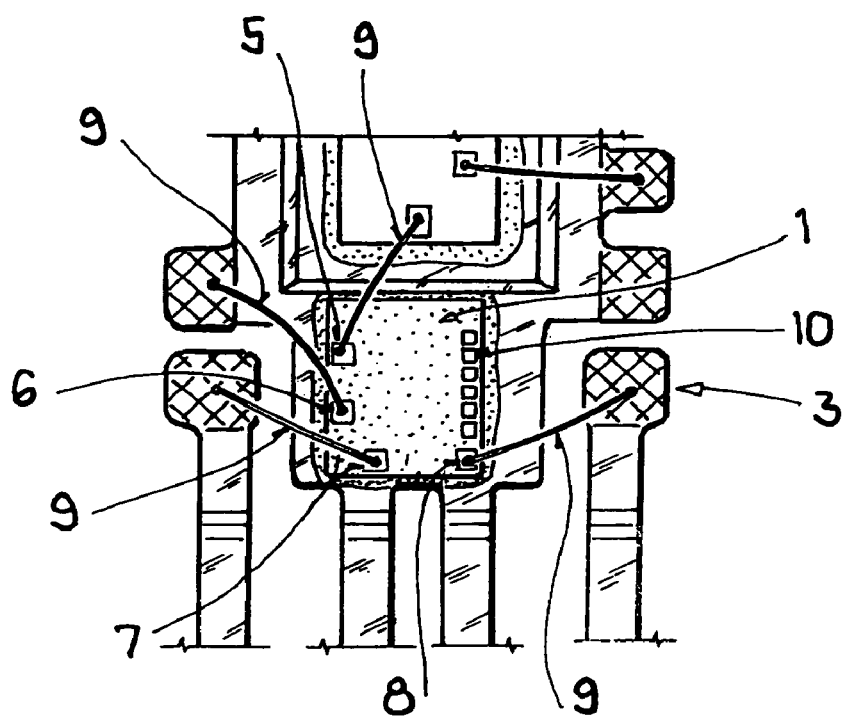
FIG. 6 is a schematic top view of a conventional infrared receiver chip, which is installed in a second standardized lead frame.
Figure 7:
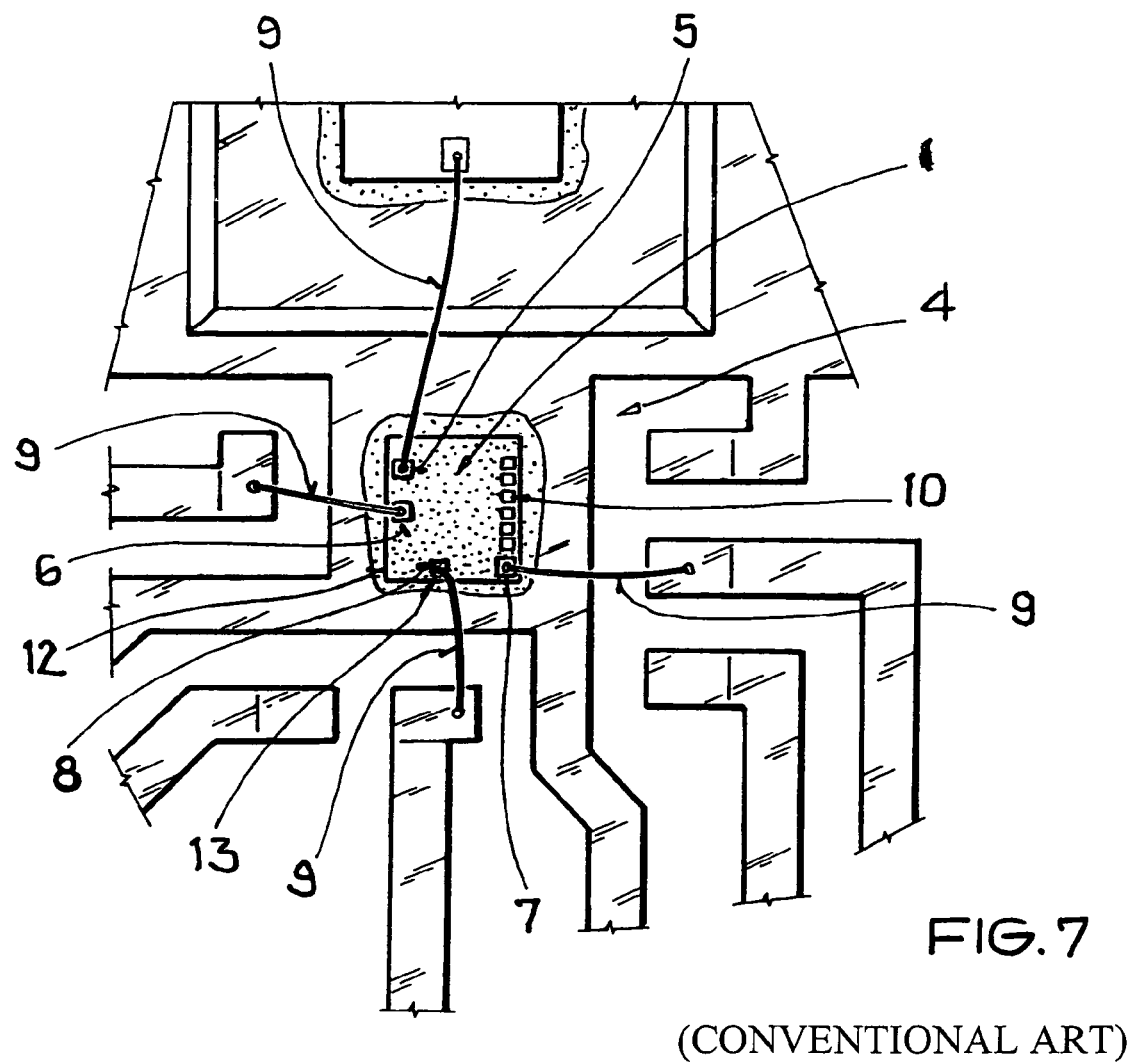
FIG. 7 is a schematic top view of a conventional infrared receiver chip, which is installed in a third standardized lead frame.

The infrared receiver chip 1 according to the present example embodiment has a signal input contact area 5, a ground contact area 6, a signal output contact area 7, and a power supply contact area 8. As has already been explained with reference to FIGS. 5, 6, and 7 according to the conventional art, the individual contact areas 5, 6, 7, and 8 are, or will be, connected to associated connection points of the lead frame 2 by bond wires 9.

In the first standardized lead frame 2, the signal input point IN is located above the chip installation point, i.e. the upper edge of the infrared receiver chip 1. The ground point GND, the signal output point OUT, and the power supply point VCC are arranged to the left of the chip installation point, i.e. in the vicinity of the left edge of the infrared receiver chip 1.

In contrast, the second standardized lead frame, as shown in a schematic top view in FIG. 3, has the power supply point VCC to the right of the chip installation point, i.e. in the vicinity of the right edge of the infrared receiver chip 1.

In further contrast, the third standardized lead frame 4, as shown in a schematic top view in FIG. 4, has a power supply point VCC located below the chip installation point, i.e. in the vicinity of the lower edge of the infrared receiver chip 1, and a signal output point OUT positioned to the right of the chip installation point, i.e. in the vicinity of the right edge of the infrared receiver chip 1.

The infrared receiver chip 1 according to the present example embodiment has a special arrangement of the individual contact areas 5, 6, 7, and 8 such that when the infrared receiver chip 1 is installed in any of the three standardized lead frames 2, 3, or 4, the shortest possible implementation of the bond wires 9 is accomplished, i.e. an approximately direct run of the individual bond wires from the respective contact areas to the associated connection points, wherein the individual bond wires 9 do not cross or intersect in any of the installation states as shown in, for example, one of the standardized lead frames 2, 3, or 4.

According to the present example embodiment, the signal input contact area 5 and the ground contact area 6 are positioned adjacent to one another in the vicinity of a first outer edge 12, while the power supply contact point 8 is arranged in the vicinity of a second outer edge 13 adjacent to the first outer edge 12. The signal output contact area 7 is preferably arranged between the ground contact area 6 and the power supply contact area 8 such that it is spaced apart from both the first outer edge 12 and the second outer edge 13. For example, the ground contact area 6, the signal output contact area 7, and the power supply contact area 8 can be arranged on a common line which runs at an angle from the first outer edge 12 to the second outer edge 13, as can be seen in FIGS. 2, 3, and 4.

The present invention thus creates an infrared receiver chip with an advantageous arrangement of the individual contact areas on the chip, by which the infrared receiver chip 1 can be installed in the three different designs of standardized lead frames such that the requirements for short bond wire connections and non-intersection of the individual bond wires are guaranteed to be met.

Despite the fact that the present invention is described above on the basis of a preferred example embodiment, it is not limited thereto, but rather can be modified in a variety of ways.

For example, the signal input contact area 5, the ground contact area 6, the signal output contact area 7, and the power supply contact area 8 may be located on a common line that runs at an angle from the first outer edge 12 toward the second outer edge 13.

It is further possible to arrange the contact areas 5, 6, 7, and 8 on a suitable diagonal of the infrared receiver chip. In addition, it is apparent to a person skilled in the art that the individual contact areas 5, 6, 7, and 8 do not necessarily have to be arranged on a common line, but that slight offsets relative to one another may be advantageous. The only critical factor is that the signal output contact area 7 must be positioned offset relative to the power supply contact area 8 such that the bond wires do not cross with a direct connection route when the infrared receiver chip is installed in the three different designs of standardized lead frames 2, 3, and 4.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An infrared receiver chip for installation in a standardized lead frame of an infrared receiver module having contact areas for connection to an input signal point, a ground point, a signal output point, and/or a power supply point of the lead frame by conductor paths, wherein the contact areas for connecting the ground point, the signal output point, and the power supply point are positioned on a common line running at an angle from a first outer edge to a second outer edge of the infrared receiver chip, wherein the contact area for connection to the input signal point is positioned on a line with the contact area for connection to the ground point, which line runs substantially parallel to the first outer edge that is associated with the ground point or the input point of the infrared receiver chip, and wherein, when the infrared receiver chip is installed in a standardized lead frame, the conductor paths do not intersect one another when the conductor paths are routed directly from their associated contact area to their associated function point.

2. An infrared receiver chip for installation in a standardized lead frame of an infrared receiver module having contact areas for connection to an input signal point, a ground point, a signal output point, and/or a power supply point of a lead frame by conductor paths;

wherein the contact areas are positioned on a common line running at an angle from a first outer edge to a second outer edge of the infrared receiver chip, wherein, when the infrared receiver chip is installed in a standardized lead frame, the respective conductor paths do not intersect one another when the conductor paths are routed directly from their associated contact area to their associated function point.

3. The infrared receiver chip according to claim 2, wherein the contact areas are positioned together on a diagonal of the infrared receiver chip or slightly offset with respect to the diagonal.

4. The infrared receiver chip according to claim 2, wherein the second outer edge is located adjacent to the first outer edge.

5. The infrared receiver chip according to claim 2, wherein the infrared receiver chip is a semiconductor chip.

6. The infrared receiver chip according to claim 2, wherein the conductor paths are bond wires.

7. The infrared receiver chip according to claim 1, wherein the second outer edge is located adjacent to the first outer edge.

8. The infrared receiver chip according to claim 1, wherein the infrared receiver chip is a semiconductor chip.

9. The infrared receiver chip according to claim 1, wherein the conductor paths are bond wires.

* * * * *